United States Patent
Bhushan Singh et al.

(10) Patent No.: US 9,972,402 B2
(45) Date of Patent: May 15, 2018

(54) CONTINUOUS WRITE AND READ OPERATIONS FOR MEMORIES WITH LATENCIES

(71) Applicant: QUALCOMM Incorporated, San Diego, CA (US)

(72) Inventors: Nishi Bhushan Singh, Bangalore (IN); Ashutosh Anand, Bangalore (IN); Anand Bhat, Bangalore (IN); Rajesh Tiwari, Bangalore (IN); Shankarnarayan Bhat, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 44 days.

(21) Appl. No.: 15/138,051

(22) Filed: Apr. 25, 2016

(65) Prior Publication Data
US 2017/0309348 A1    Oct. 26, 2017

(51) Int. Cl.
*G06F 11/00* (2006.01)
*G11C 29/36* (2006.01)
*G06F 3/06* (2006.01)
*G11C 29/38* (2006.01)

(52) U.S. Cl.
CPC .............. *G11C 29/36* (2013.01); *G06F 3/067* (2013.01); *G06F 3/0619* (2013.01); *G06F 3/0653* (2013.01); *G06F 3/0659* (2013.01); *G11C 29/38* (2013.01)

(58) Field of Classification Search
CPC ....... G11C 29/36; G11C 29/38; G06F 3/0619; G06F 3/0653; G06F 3/0659
See application file for complete search history.

(56) References Cited

U.S. PATENT DOCUMENTS

| | | | |
|---|---|---|---|
| 5,960,457 A | 9/1999 | Skrovan et al. | |
| 6,591,385 B1 | 7/2003 | Krech, Jr. et al. | |
| 7,502,976 B2 * | 3/2009 | Ross | G11C 29/1201 365/201 |
| 7,610,524 B2 | 10/2009 | Janzen | |
| 7,652,943 B2 | 1/2010 | Takahashi et al. | |
| 7,653,854 B2 * | 1/2010 | Anzou | G11C 29/16 714/733 |
| 8,769,355 B2 * | 7/2014 | Scott | G06F 21/755 714/719 |
| 8,799,713 B2 * | 8/2014 | Gangasani | G06F 11/27 714/30 |

(Continued)

OTHER PUBLICATIONS

Kongetira P., et al., "Niagara: A 32-Way Multithreaded SPARC Processor," IEEE Micro, Mar. 2005, vol. 25 (2), pp. 21-29.

*Primary Examiner* — Esaw Abraham
(74) *Attorney, Agent, or Firm* — Loza & Loza, LLP (57) ABSTRACT

A method and apparatus for continuous write and read operations during memory testing. The method comprises: controlling a signal generator; triggering a write address and a data field operation each memory cycle; triggering a write signal to write to a memory each memory clock cycle; and reading a read address and a read data operation to the memory. An additional embodiment provides an apparatus for advanced memory latency testing. The apparatus includes a data generator trigger in communication with a signal generator and an address generator trigger also in communication with the signal generator.

13 Claims, 12 Drawing Sheets

(56) References Cited

U.S. PATENT DOCUMENTS

| | | | |
|---|---|---|---|
| 9,024,650 B2* | 5/2015 | Somachudan | G01R 31/3187 |
| | | | 324/750.3 |
| 9,448,942 B2* | 9/2016 | Moyer | G06F 12/0864 |
| 9,548,137 B2* | 1/2017 | Querbach | G06F 11/263 |
| 2012/0054564 A1* | 3/2012 | Tiwary | G11C 29/16 |
| | | | 714/718 |

* cited by examiner

CONTINUOUS WRITE AND READ OPERATIONS FOR MEMORIES WITH LATENCIES

BACKGROUND

Field

The present disclosure relates generally to wireless communication systems. More specifically the present disclosure related to methods and apparatus for continuous write and read operations for memories with latencies.

Background

Wireless communication devices have become smaller and more powerful as well as more capable. Increasingly users rely on wireless communication devices for mobile phone use as well as email and Internet access. At the same time, devices have become smaller in size. Devices such as cellular telephones, personal digital assistants (PDAs), laptop computers, and other similar devices provide reliable service with expanded coverage areas. Such devices may be referred to as mobile stations, stations, access terminals, user terminals, subscriber units, user equipment, and similar terms.

These wireless communication devices typically use a system-on-chip (SoC) to provide many of the functions of the device. A SoC is an integrated circuit that combines all components of a computer or other electronic system on a single chip. The SoC device may contain digital, analog, mixed-signal, and radio frequency (RF) functions on a single substrate. SoCs are used widely due to their low power consumption.

A SoC may consist of a microcontroller or digital signal processor (DSP) core, memory blocks including a selection of ROM, RAM, EEPROM, and flash memory, as well as timing sources. The timing sources may include oscillators and phase-locked loops (PLL). Peripherals, including counter-timers, real-time timers, and power-on reset generators may also be incorporated. A wide variety of external and internal interfaces including analog-to-digital converters (ADC), digital-to-analog converters (DAC), voltage regulators and power management circuits are also typically included in a SoC. The desired performance of the end device may result in different mixes of the above functions to be included in the SoC. The SoC also includes a bus system for connecting the various functional blocks.

Testing all of the SoC components is needed to ensure that all electronic devices incorporated into user devices function correctly. This testing may be time-consuming and expensive. Most SoCs have multiple memories which may be organized into hierarchies of caches. These cache structures may give rise to latencies when the memories are testing. Memory latency is the number of clock cycles requires for a memory to perform a read/write operation. The default memory has a latency of one, where the read/write operation may be performed on every clock cycle for different addresses and data. In memory built-in self test (MBIST) testing back to back testing involves accessing the memory with different data on a different address every clock cycle. The L2 cache memory of the SoC processors has inherent latencies which may vary with the use of the SoC. The MBIST controller used for test and memory validation does not support back to back read/write access for all memories. In addition, the time needed to access data stored in the memory cache may contribute to test time. This problem becomes apparent when second level memories, known as L2 memories are tested. These level 2 memories may have latencies greater than one. This poses a problem for current MBIST architectures as back to back write/read operations on processor memories having latencies greater than one are not supported. As a result, L2 memories may not be adequately tested with undetected failures potentially found in an end user device.

There is a need in the art for a method and apparatus that enables back to back wire/read operations on L2 memories and also detects failures on those memories.

SUMMARY

Embodiments described herein provide a method for continuous write and read operations during memory testing. The method comprises: controlling a signal generator; triggering a write address and a data field operation each memory cycle; triggering a write signal to write to a memory each memory clock cycle; and reading a read address and a read data operation to the memory.

An additional embodiment provides an apparatus for advanced memory latency testing. The apparatus includes a data generator trigger in communication with a signal generator and an address generator trigger also in communication with the signal generator.

A further embodiment provides an apparatus for continuous write and read operations during memory testing. The apparatus includes: means for controlling a signal generator; means for triggering a write address and a data field operation each memory cycle; means for triggering a write signal to write to a memory each memory clock cycle; and means for reading a read address and a read data operation to the memory.

A yet further embodiment provides a non-transitory computer-readable medium, containing instructions, which when executed cause a processor to perform the following steps: controlling a signal generator; triggering a write address and a data field operation each memory cycle; triggering a write signal to write to a memory each memory clock cycle; and reading a read address and a read data operation to the memory.

DETAILED DESCRIPTION

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

As used in this application, the terms "component," "module," "system" and the like are intended to include a computer-related entity, such as, but not limited to hardware, firmware, a combination of hardware and software, software, or software in execution. For example, a component may be, but is not limited to being, a process running on a processor, a processor, an object, an executable, a thread of execution, a program and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

As used herein, the term "determining" encompasses a wide variety of actions and therefore, "determining" can include calculating, computing, processing, deriving, investigating, looking up (e.g., looking up in a table, a database or another data structure), ascertaining and the like. Also, "determining" can include resolving, selecting choosing, establishing, and the like.

The phrase "based on" does not mean "based only on," unless expressly specified otherwise. In other words, the phrase "based on" describes both "based only on" and "based at least on."

Moreover, the term "or" is intended to man an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

The various illustrative logical blocks, modules, and circuits described in connection with the present disclosure may be implemented or performed with a general purpose processor, a digital signal processor (DSP), an application specific integrated circuit (ASIC), a field programmable gate array (FPGA), or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM, and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A computer-readable medium may be any available medium that can be accessed by a computer. By way of example, and not limitation, a computer-readable medium may comprise RAM, ROM, EEPROM, CD-ROM or other optical disk storage, magnetic disk storage, or other magnetic storage devices, or any other medium that can be used to carry or store desired program code in the form of instructions or data structures and that can be accessed by a computer. Disk and disc, as used herein, includes compact disk (CD), laser disk, optical disc, digital versatile disk (DVD), floppy disk, and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein, such as those illustrated by FIGS. 6-14, can be downloaded and/or otherwise obtained by a mobile device and/or base station as applicable. For example, such a device can be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a mobile device and/or base station can obtain the various methods upon coupling or providing the storage means to the device. Moreover, any other suitable technique for providing the methods and techniques described herein to a device can be utilized.

Embodiments described herein relate to an advanced memory latency test architecture. The method and apparatus described below provide enhancements to traditional MBIST architecture that enable at-speed testing with memories of various latencies. The advanced memory latency test (AMLT) triggers the address generator and data generator functions to generate test address and data every n cycles, where n is the latency of the memory being tested. The address and data may be generated in synchronization with the physical memory. When testing, the AMLT hardware controls the signal generation module and triggers the address and data so that the address and data signals are generated by the respective module every memory clock cycle.

Latency for a memory is defined as the number of clock cycles required for a memory to perform a read/write operation. The default memory has a latency of one, where the read/write operation on different memory address may be performed on every clock cycle. Many processor architectures provide multiple levels of memory, which may include a level 2 or L2 cache memory. Such a memory support a multiple latency configuration.

A SoC is an integrated circuit that combines all components of a computer or other electronic system on a single chip. It may contain digital, analog, mixed-signal, and radio frequency (RF) functions. A SoC may consist of: a microcontroller or digital signal processor (DSP) core; memory blocks, including a selection of read-only memory (ROM), random access memory (RAM), electrically erasable programmable read-only memory (a type of non-volatile memory), and flash memory; timing sources including oscillators and phase-locked loops (PLL); peripherals including counter-timers, real-time timers, and power-on or reset generators; external interfaces; analog interfaces including analog to digital converters (ADC), digital to analog converters (DAC); voltage regulators; and power management circuits. A bus connects these blocks within the SoC.

Many SoCs incorporate an Acorn Risc Machine (ARM) proprietary processor into their architecture. A reduced instruction set computing (RISC) device may be used as a building block within a larger and more complex device, such as a SoC. The SoC may also use generic processors in place of the ARM. The processors may be configured for various environments. A RISC based design means that processors require significantly fewer transistors than a complex instruction set computing (CISC) device, such as those found in most personal computers. This approach results in lower cost, less heat production, and less power consumed. As a result, processors are used extensively in portable devices such as wireless devices and tablet, as well as in embedded systems. A processor uses a simpler design with more efficient multi-core central processing units (CPU).

A generic processor core may support a 32-bit address space and use 32-bit arithmetic. Instructions set for processor often use 32-bit wide fixed length instructions, however, some versions support a variable length instruction set that uses 32-bit and 16-bit wide instruction sets for improved code density. In many cases, a SoC will use a standard processor core and will use a 32-bit address space and 32-bit arithmetic. However, some SoCs allow for a reduction in memory size by blowing a fuse. This process of reducing memory size by blowing a fuse is known as de-featuring. As an example, in one SoC core, the cache may be reduced from 1 MB to 512 KB during the manufacturing process. This allows a simple memory size reduction without the time and expense of a redesign.

Figure 1:
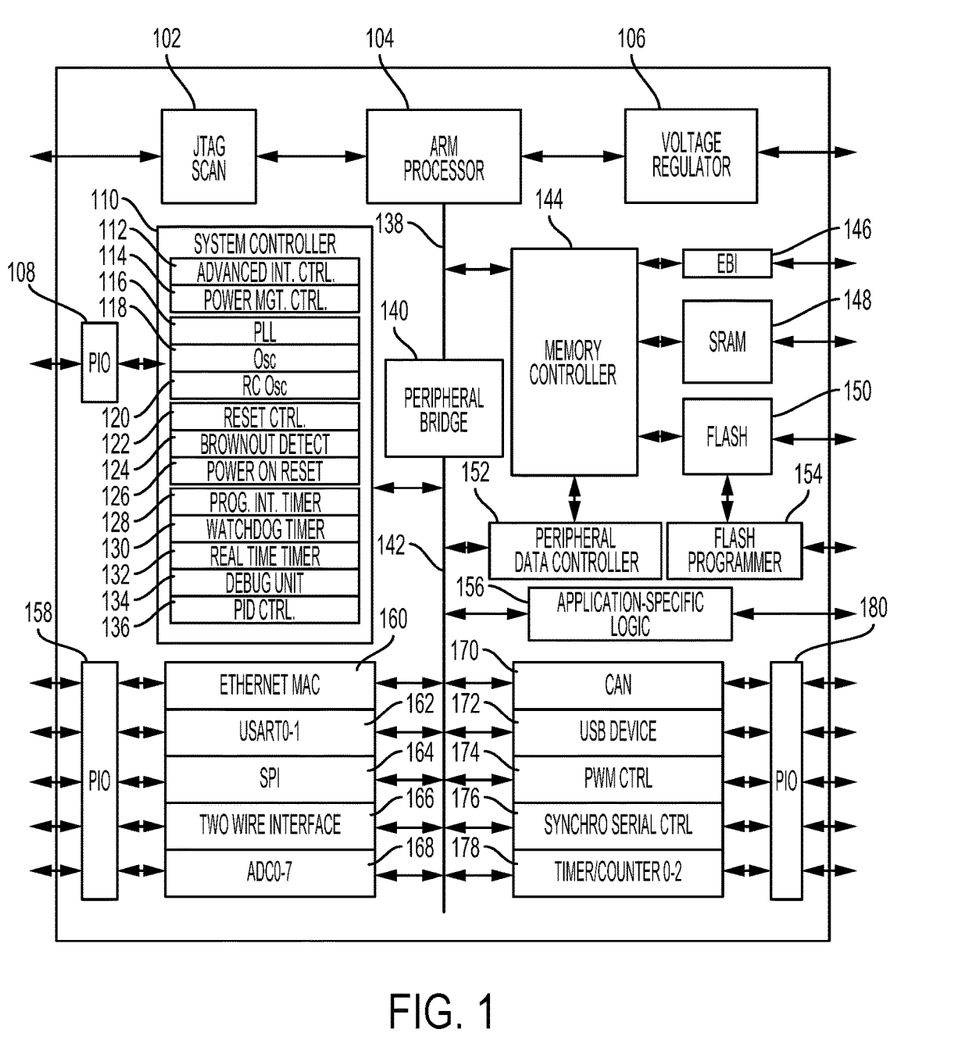
FIG. 1 is a block diagram of a SoC, in accordance with embodiments disclosed herein.

FIG. 1 illustrates a SoC, 100. The assembly 100 includes joint test action group (JTAG) scan device 102, which receives input signals for scanning. These signals are scanned before being sent to the processor 104. The processor 104 may also send input to JTAG scan device 102, which in turn may provide output. The processor also interfaces with voltage regulator 106. The SoC 100 may also incorporate a first peripheral input/output interface (PIO) 108. This PIO 108 interfaces with a system controller 110. System controller 110 may incorporate an advanced interface controller 112, a power management controller 114, a phase locked loop (PLL) 116, an oscillator 118, a resistor-capacitor (RC) oscillator 120, a reset controller 122, a brownout detector 124, a power on reset device 126, a program interrupt timer 128, a watchdog timer 130, a real time timer 132, a debug unit 134, and a proportional/integral/derivative (PID) controller 136. All of the devices under the control of system controller 110 interface through the PIO.

The processor 104 interfaces with peripheral bridge 140, which also provides input and output interface with the system controller 110. The peripheral bridge communicates with multiple components using an application peripheral bus (APB) 142. An internal bus 138 operates in conjunction with the peripheral bridge 140 to communicate with additional devices within the SoC 100. The internal bus 138 may be an application specific bus (ASP) or an application handling bus (AHB). Memory controller 140 interfaces with processor 104 using internal bus 138. The memory controller 140 also communicates with the external bus interface (EBI) 146. Memory controller 140 is also in communication with static random access memory (SRAM) 148, and flash memory 150. Flash memory 150 is in communication with flash programmer 154. The memory controller 144 is also in communication with peripheral data controller 152. Additional application specific logic 156 communicates with the internal bus 138 and may also have external connections. A second PIO 158 provides communication with an Ethernet medium access control (MAC) 160. The second PIO 158 also communicates with a universal asynchronous receiver/transmitter 162, a serial peripheral interface (SPI) 164, a two wire interface 166, and an analog to digital converter 168. These devices and interfaces connect through internal bus 138 with a controller area network bus (CAN) 170, a universal serial bus (USB) devices 172, a pulse width modulator (PWM) controller 174, a synchro serial controller 176, and a timer/counter 178. These devices, CAN 170, USB device 172, PWM controller 174, synchro serial controller 176 and timer/counter 178 interface with third PIO 180, which provides external input and output. While these elements are typical of many SoCs, other devices may be incorporated, and some may not be included.

Figure 2:
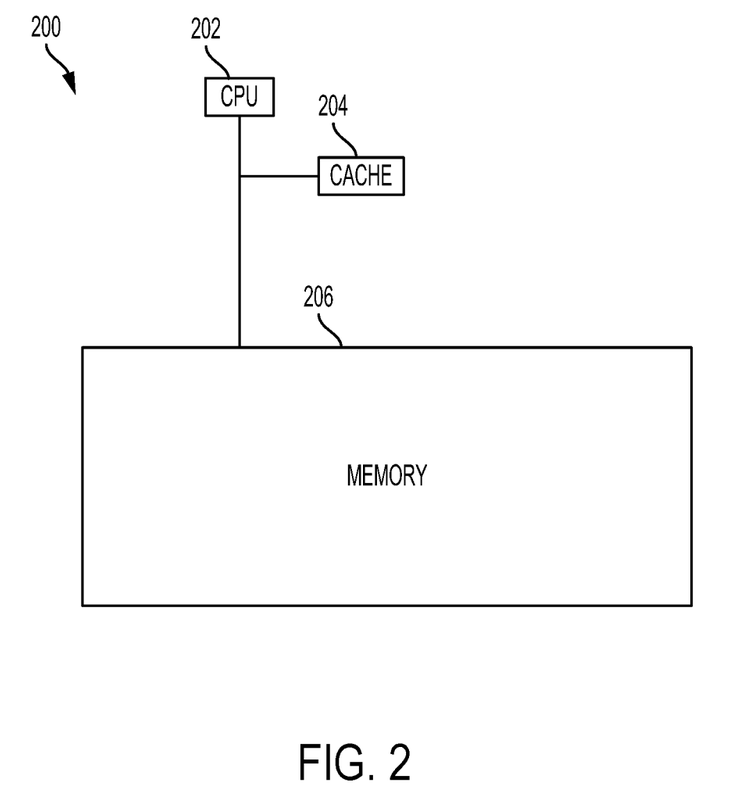
FIG. 2 is a block diagram of a memory cache, in accordance with embodiments disclosed herein.

FIG. 2 is a block diagram of a CPU, memory cache and operating memory such as Random Access Memory (RAM). The assembly 200 includes a central processing unit (CPU) 202, a cache 204, and a memory 206. A L2 memory establishes a working cache of memory close to the CPI 202 that may be accessed at a faster rate than memory located further away. Memory hierarchies take advantage of memory locality, which is the principle that future memory accesses are near past accesses. Memories may take advantage of two types of locality: temporal locality, or locality near in time, and spatial locality, where the next access is close to the last or recent accesses. Memory hierarchies exploit locality by caching, or keeping near the processor data which is likely to be used again. This arises because of the nature of memories. Large memories may store large amounts of data, however, may be located farther away, which may increase access times. Small memories may be more readily placed closer to the processor data, which may increase access speed, however, small memories cannot store large amounts of data as compared to the large memories. Caching assists in providing faster access times in combination with a larger memory.

A cache is a memory used to temporarily store data. Caches may be used to store instructions and data for the processor, which may use a level 1 cache. A L2 cache may be used to optimize the amount of time required to provide data to the CPU when a miss occurs on the L1 cache. The L2 cache may be designed so that most of the time the processor is able to find the data it needs in the L2 cache. L2 cache performance may be a significant determinant of memory performance. As processor speeds have increased, the need for the L2 cache memory to function seamlessly has increased.

Figure 3:
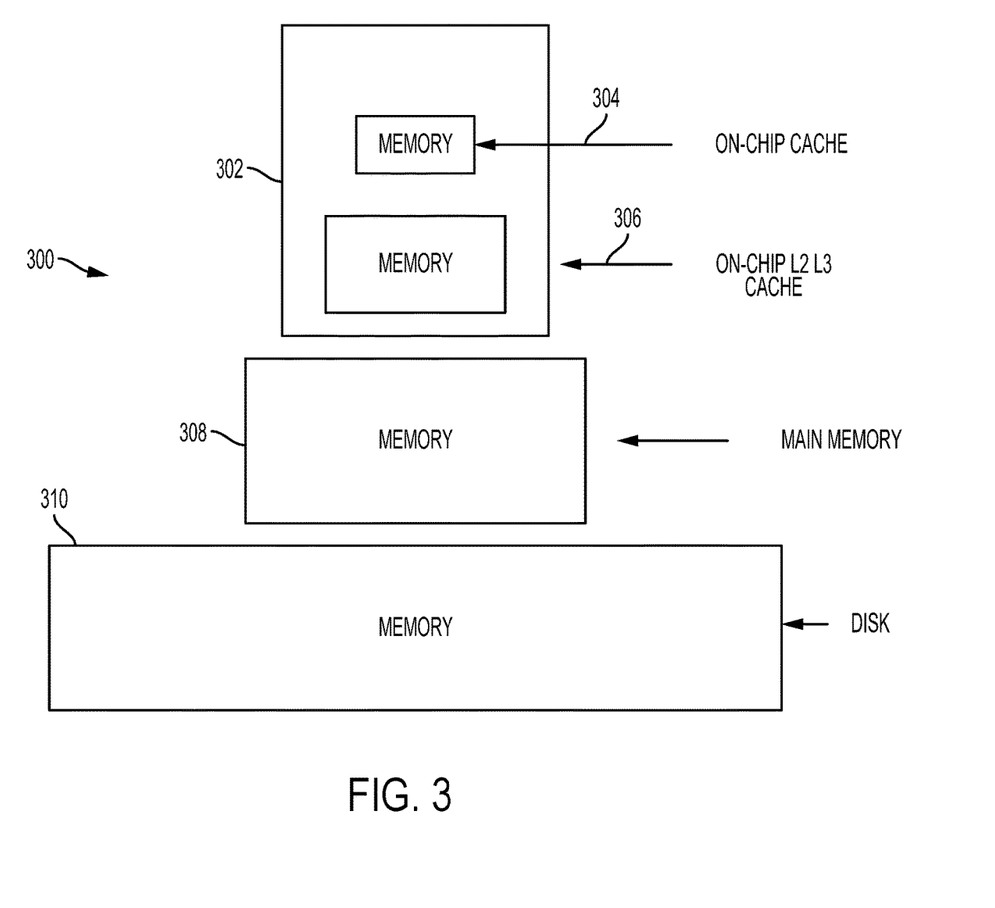
FIG. 3 is a block diagram of a memory hierarchy, in accordance with embodiments disclosed herein.

FIG. 3 is a block diagram of a memory hierarchy. The assembly 300 provides a cache 202 with multiple memories 304 and 306. Memory 304 is the on-chip cache memory. Memory 306 is the on-chip L2 cache. Memory 308 is the main memory for the device. Disk memory 310 supports the other memories, 304, 306, and 308 with storage capacity.

Figure 4:
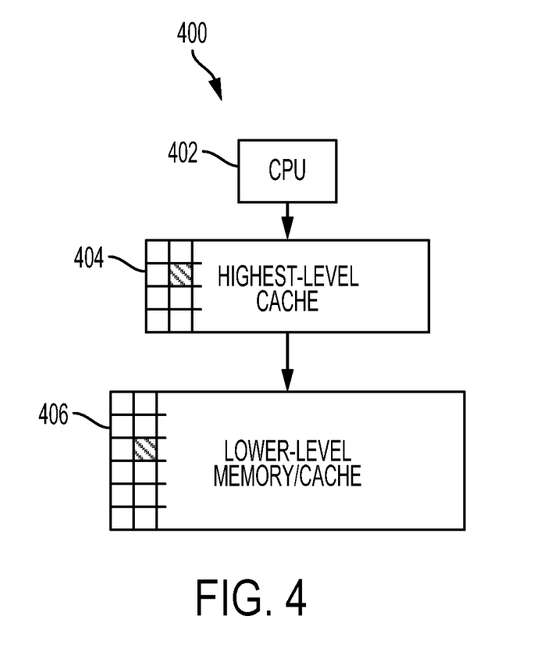
FIG. 4 illustrates storage in high-level and low-level memory caches, in accordance with embodiments disclosed herein.

FIG. 4 depicts the relationship between high-level and low-level caches. The assembly 400, includes CPU 402. CPU 402 communicates with highest-level cache 402. Highest level cache 402 communicates with lower-level memory cache 404 to retrieve data stored in the lower-level memory cache 404.

In operation, a memory cache, such as high-level memory cache 404 and lower-level memory cache 406 follow a number of fundamental principles. A cache hit occurs when an access results in data being found in the cache. A cache miss occurs when the data is not found. The amount of time to access the higher-level cache 404 is known as the hit time. If the data is not found, or successfully accessed, then a lower-level cache, such as lower-level memory cache 406 must be accessed. This incurs a miss penalty, which is the time to move the data from the lower level cache 406 to the upper level cache 404, and finally to the CPU 402. These operations may be tracked, with the hit ration being the percentage of time that the desired data is found in the higher level cache. The miss ratio is computed by the formula: 1−hit ratio.

When a cache miss occurs, the data needs to be transferred to the higher level cache from lower level memory. The cache block, also known as cache line size, refers to the amount of data that is transferred when a cache miss occurs. One option that may improve cache performance is to incorporate an instruction cache, which is a cache that holds only instructions. A data cache may also be used to store only data. A unified cache may hold both instructions and data.

Figure 5:
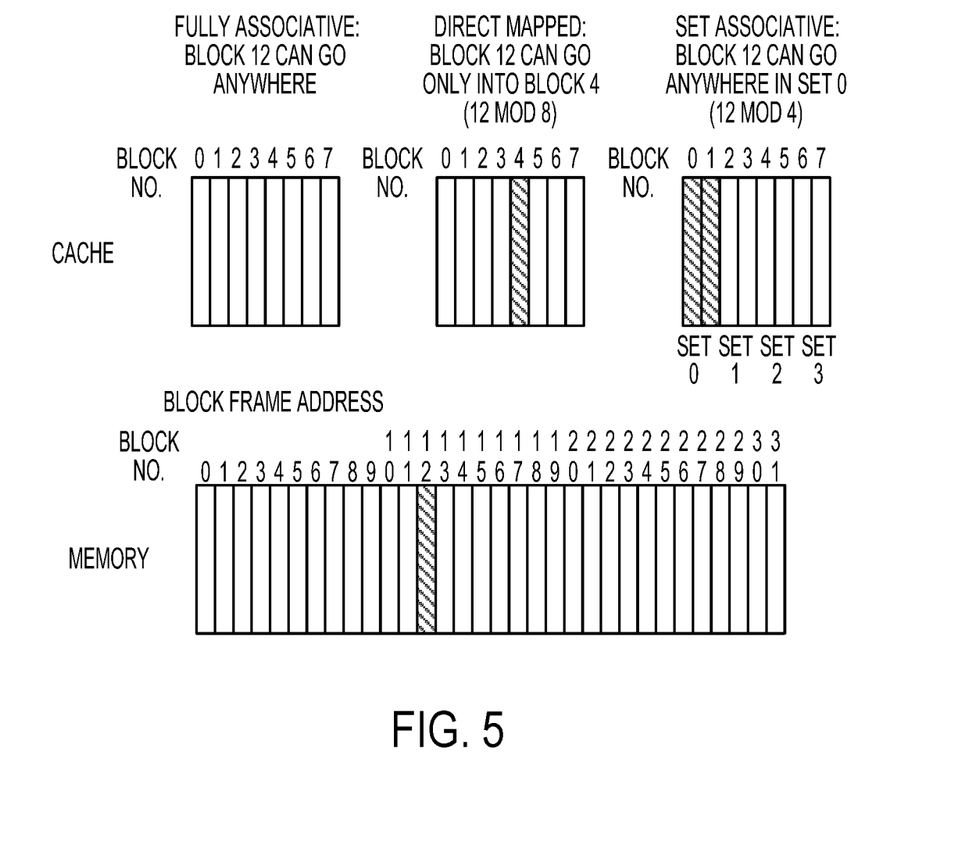
FIG. 5 depicts cache organization, in accordance with embodiments disclosed herein.

FIG. 5 shows how a cache may be organized, and how data may be placed in the cache. A block 12 is to be placed in an 8 block cache. In a fully associative cache, block 12 may be placed anywhere within the cache. A set associative (SA) mapping scheme may also be used to place a block in a cache. In SA mapping the formula for block placement is: SA Mapping=block number modulo number sets. A set is a collection of blocks cached with the same cache index. Associative mapping reflects the degree of freedom in placing a particular block of memory. In a direct mapped cache block 12 may only be placed into block 4 (12 mod 8). In a set associative cached block 12 may be placed anywhere in set 0 (12 mod 4). FIG. 5 also illustrates the block frame address that locates where block 12 has been placed.

Figure 6:
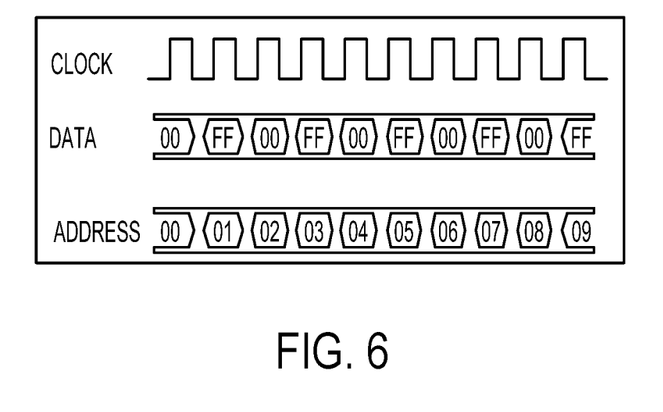
FIG. 6 illustrates back-to-back addressing at the controller every clock cycle, in accordance with embodiments disclosed herein.

FIG. 6 illustrates the back-to-back address/data in relation to the clock cycle. In this figure, address/data is generated by the controller every clock cycle. When this occurs, the relationship between the address/data generation affects the transaction at the L2 cache memories.

Figure 7:
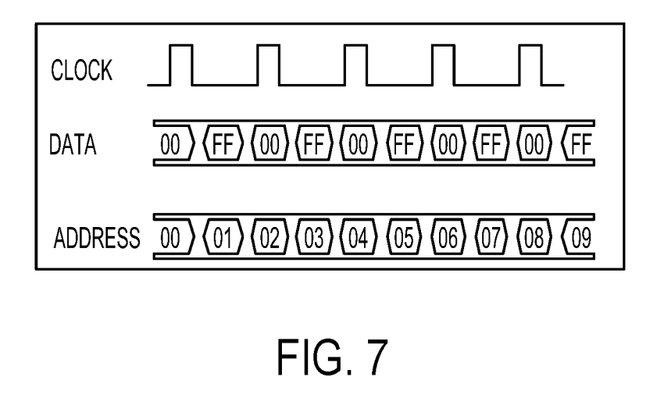
FIG. 7 shows a transaction at the L2 cache memories, in accordance with embodiments disclosed herein.

FIG. 7 shows the transaction at the L2 cache memories when address/data is generated every clock cycle. This figures depicts the latency of the L2 cache memory and how that latency affects the memory testing. For example, back-to-back read/write access is not supported with the depicted latency of the L2 cache. When testing a L2 cache memory of the SoC processor chip, these latencies may affect system performance.

Figure 8:
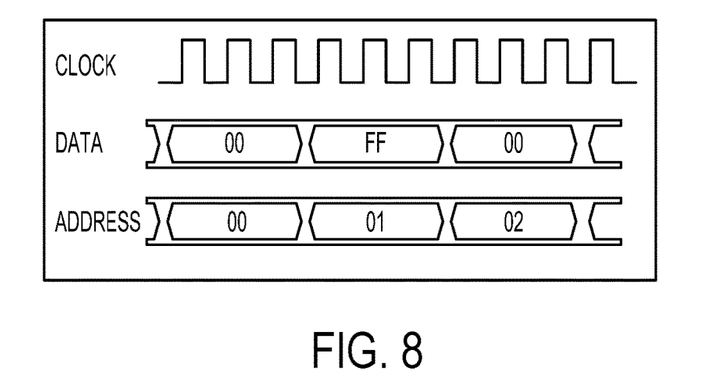
FIG. 8 illustrates address/data generated every three cycles, synchronized with the physical memory, in accordance with embodiments disclosed herein.

FIG. 8 depicts a write/read operation that occurs every three cycles, in sync with the physical memory with a latency of three.

Figure 9:
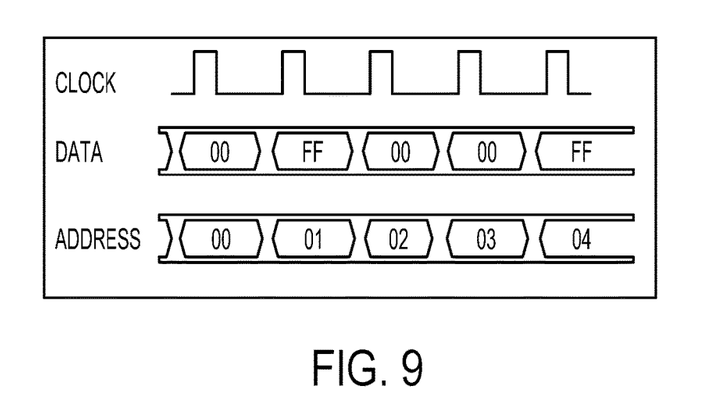
FIG. 9 shows address/data generated every cycle of the physical memory, in accordance with embodiments disclosed herein.

FIG. 9 shows the address/data that is generated with every cycle of the physical memory during an at-speed test. At-speed testing may be accomplished with the AMLT apparatus incorporated into the MBIST or BIST controller. AMLT enables back-to-back access of the memory addresses with different test data every clock cycle. The AMLT apparatus may be used on memories having multiple latencies. The AMLT hardware triggers the address generator and data generator modules to generate address and test data every n cycles and then compares written and read memory data, where n is the latency of the memory. This results in a true at-speed test of the memory. AMLT may be adjusted to support a variety of memory latencies.

Figure 10:
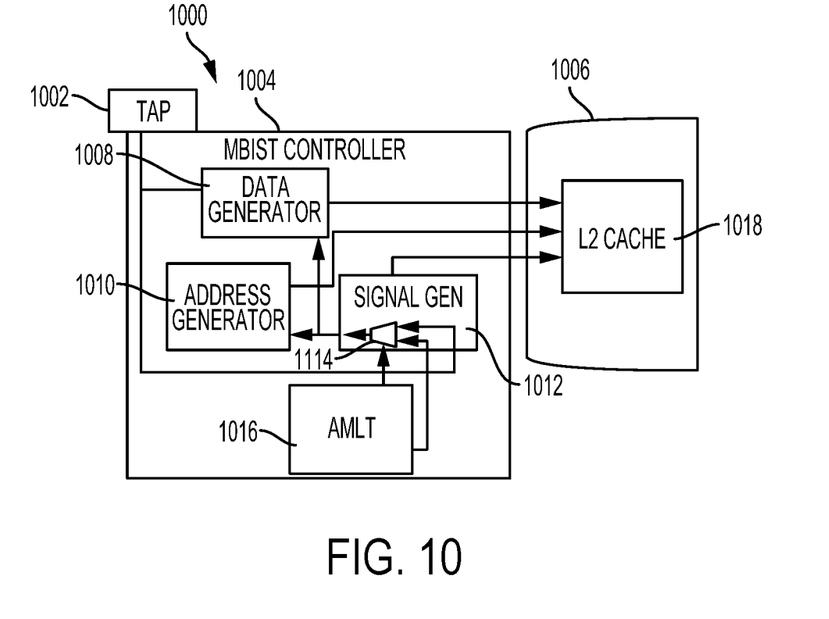
FIG. 10 is a block diagram of the AMLT architecture, in accordance with embodiments disclosed herein.

FIG. 10 is a block diagram of a test architecture that incorporates the AMLT. The system 1000 includes test access protocol (TAP) 1002. A protocol is a set of rules that delineate the conduct and procedure that the test will follow. The TAP 1002 is in communication with MBIST controller 1004. Within the MBIST controller 1004 signals from the TAP 1002, which may be test-specific signals, are routed to data generator 1004 and signal generator 1012. Signal generator 1012 is in communication with address generator 1010 and data generator 1008. Signal generator 1012 includes multiplexer 1014. AMLT 1016 is in communication with signal generator 1014 and via multiplexer 1014 with data generator 1008 and address generator 1010. Data generator 1008 also communicates with memory 1006, which includes L2 cache memory 1018.

Figure 11:
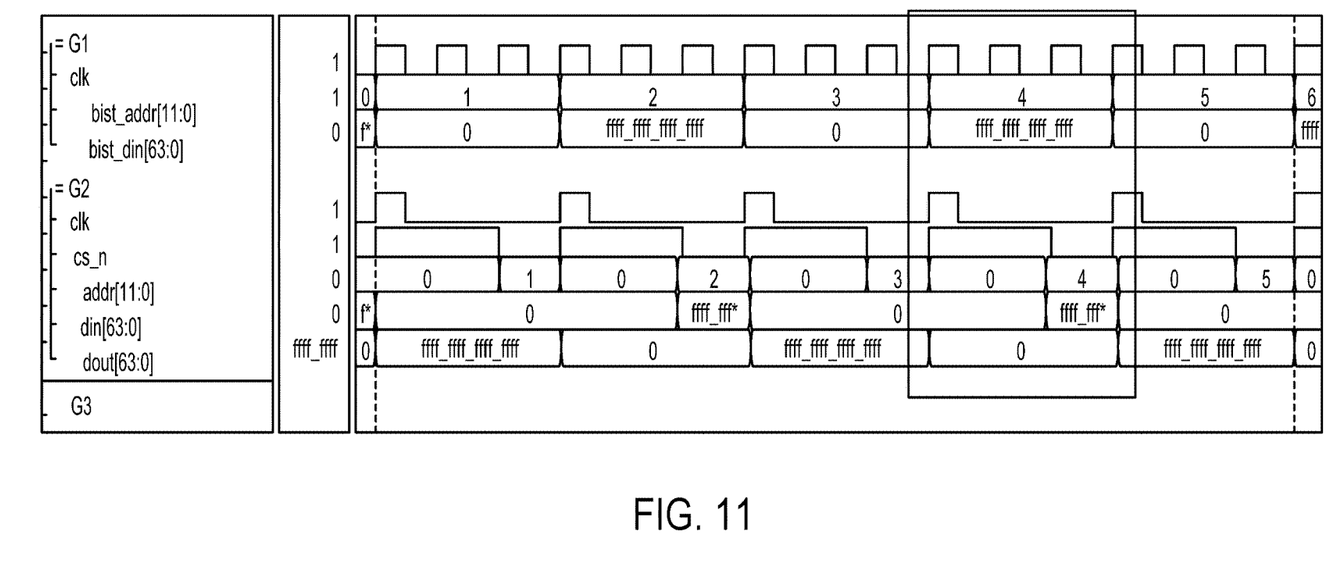
FIG. 11 illustrates read/write operations using the AMLT, in accordance with embodiments disclosed herein.

FIG. 11 provides a view of a L2 memory test with enhanced MBIST architecture. It is evident from a study of FIG. 11 that the address and data do not switch every cycle. As a result, real-time testing at speed may require considerable test time. Using the AMLT apparatus described herein provides for real-time testing of L2 memories. G1 group of signals is the normal MBIST TAP timing of the L2 memory chip. G2 group of signals is the enhanced MBIST timing of the L2 memory chip with different data and address on every clock cycle. In the timing diagram of FIG. 11, G1 is the normal MBIST TAP signal and G2 is the enhanced MBIST timing signal. The clock (clk) rising edge signal is used to clock the testing signals. The signal designated bist_addr

[11:0] is a BIST address signal. Similarly, the signal denoted bist_din[63:0] is a BIST data input signal, showing the input of the testing signal. The signal denoted cs_n, which is the chip select NOT signal, triggers address generation, data generation, or multiplexer selection working in conjunction with the AMLT 1016. The signal cs_n provides that when the signal is low (logic 0), the chip will react to the other signal inputs shown in FIG. 11. When cs_n is low or zero is the only time that the clock, address lines, and data input affect the chip being tested.

Figure 12:
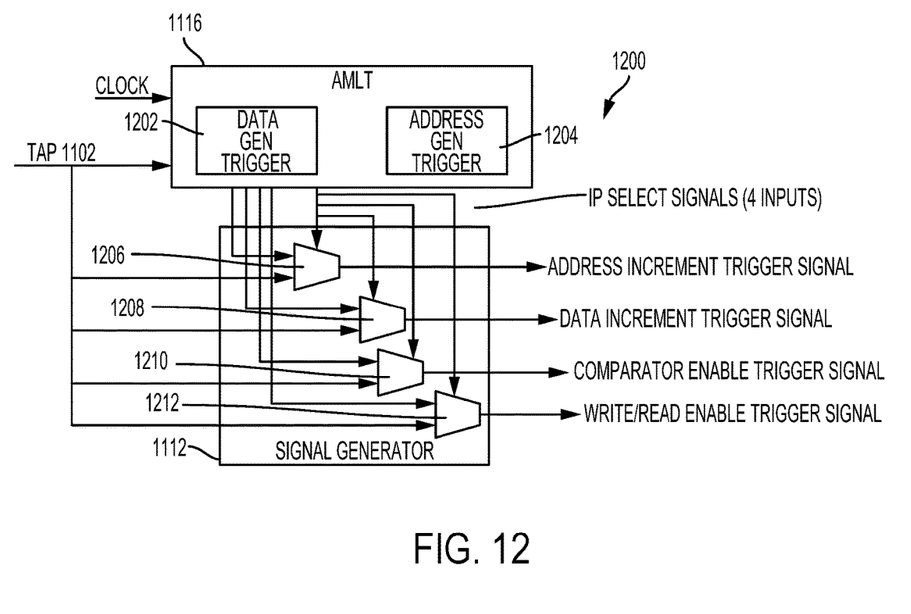
FIG. 12 is a block diagram of the AMLT, in accordance with embodiments disclosed herein.

FIG. 12 is a block diagram of the AMLT 1016 in FIG. 10 that generates the enhanced MBIST timing. The AMLT assembly 1116 includes data generator trigger 1202 and address generator trigger 1204. The data generator trigger 1202 is in communication with the signal generator 1112. More specifically data generator trigger 1202 provides input to four multiplexers 1206, 1208, 1210, and 1212 located within the signal generator 1012. TAP 1102 completes the remaining inputs to the four multiplexers 1206, 1208, 1210, and 1212. Multiplexer 1206 also receives input from AMLT 1016, and outputs an address increment trigger signal. The address increment trigger signal provides input to the address generator block 1010 of FIG. 10. Multiplexer 1208 receives input from AMLT 1016 and outputs a data increment trigger signal. The data increment trigger signal acts in conjunction with the data generator block 1008 for FIG. 10. Multiplexer 1210 receives input from AMLT 1016 and outputs a comparator enable trigger signal. The comparator enable trigger signal acts in conjunction with the signal generator block 1012 of FIG. 10 to compare both written and read data. Multiplexer 1212 receives input from AMLT 1016 and outputs a write/read enable trigger signal. The write/read enable trigger signal also operates in conjunction with the signal generator block 1112 of FIG. 12 to write or read data to or from the L2 memory. Each of the multiplexers 1206, 1208, 1210, and 1212 also receives input from the controller lines from the AMLT to select which set of input signals are selected out.

Figure 13:
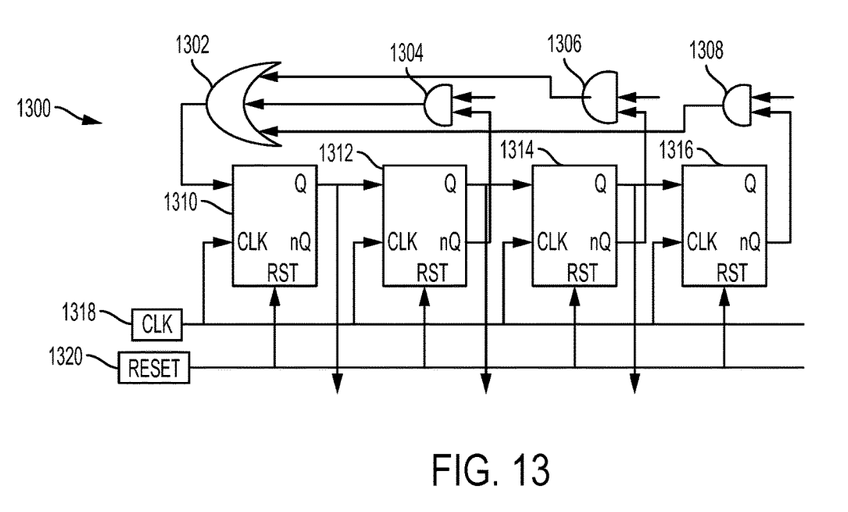
FIG. 13 is an internal block diagram of the AMLT, in accordance with embodiments disclosed herein.

FIG. 13 illustrates the logic structure of the AMLT 1116. The assembly 1300 includes exclusive OR gate 1302. Three AND gates, 1304, 1306, and 1308 provide successive inputs. Specifically, AND gate 1308 receives a clock input and an input from q flip-flop 1316. AND gate 1308 then provides one input to exclusive OR gate 1302. Similarly, AND gate 1306 receives a clock signal and an input from q flip-flop 1314 and then provides one input to exclusive OR gate 1302. AND gate 1304 receives a clock input and an input from q flip-flop 1312 and provides an output to exclusive OR gate 1302. Exclusive OR gate 1302 provides one output to q flip-flop 1310. Q flip-flop 1310 also receives a clock input and a reset input, as do q flip-flops 1312, 1314, and 1316.

Figure 14:
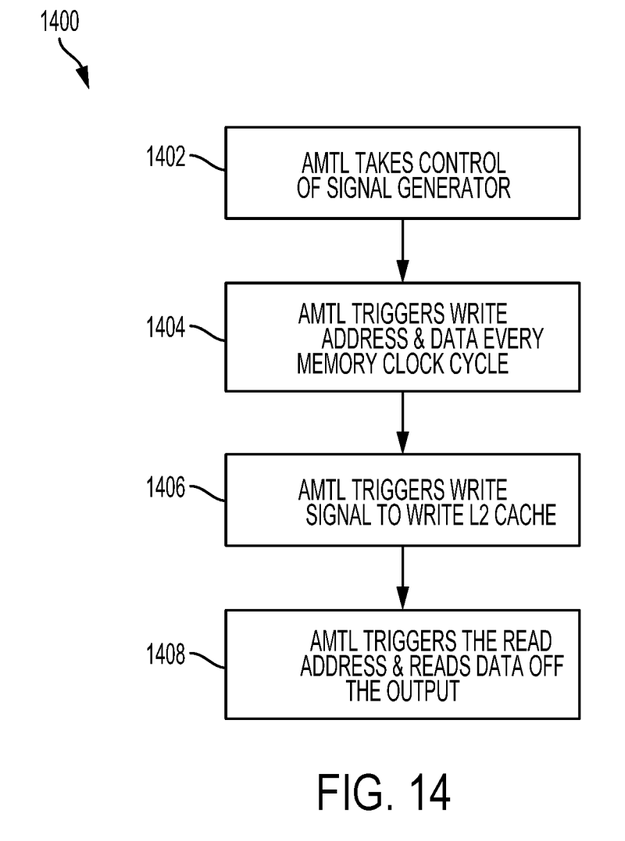
FIG. 14 is a flowchart of a method of memory testing, in accordance with embodiments disclosed herein.

FIG. 14 is a flow diagram of L2 memory testing using the AMLT apparatus and method described herein. The method 1400 begins at block 1402 when the AMLT takes control of the signal generator used in memory testing. Then, in block 1404, the AMLT triggers a write address and data every cycle of the memory clock. This provides for at-speed memory testing. In block 1406 the AMLT triggers a write signal to write to the L2 cache memory. Once the signal has been written to the L2 cache memory, the AMLT triggers the read address and reads the data from the output of the L2 cache.

It is understood that the specific order or hierarchy of blocks in the processes disclosed is an illustration of exemplary approaches. Based upon design preferences, it is understood that the specific order or hierarchy of blocks in the processes may be rearranged. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. An apparatus for dynamic testing of a plurality of memory devices on an integrated circuit device, the apparatus comprising:
    a first memory device of the plurality of memory devices having a first latency requirement;
    a second memory device of the plurality of memory devices having a second latency requirement;
    a memory test controller, configured to:
        receive a first clock signal having a first frequency corresponding to the first latency requirement,
        determine a second frequency corresponding to the second latency requirement, and
        generate a second clock signal having the second frequency;
    a data generator configured to send test data to either the first memory device, according to the first clock signal, or the second memory device, according to the second clock signal; and
    an address generator configured to send a test address to either the first memory device, according to the first clock signal, or the second memory device, according to the second clock signal.

2. The apparatus of claim 1, wherein the memory test controller comprises:
    a first multiplexer configured to generate an address increment trigger signal to the address generator to generate the address;
    a second multiplexer configured to generate a data increment trigger signal to the data generator to generate the data;
    a third multiplexer configured to generate a comparator enable trigger signal; and
    a fourth multiplexer configured to generate a write/read enable trigger signal.

3. The apparatus of claim 1, wherein the memory test controller comprises:

an exclusive OR gate;
a first AND gate in communication with the exclusive OR gate;
a second AND gate in communication with the exclusive OR gate; and
a third AND gate in communication with the exclusive OR gate.

4. The apparatus of claim 3, wherein the memory test controller further comprises:
a first flip-flop providing an input to the first AND gate;
a second flip-flop providing an input to the second AND gate;
a third flip-flop providing an input to the third AND gate; and
a fourth flip-flop receiving a select signal from the exclusive OR gate and the first clock signal.

5. The apparatus of claim 4, wherein the fourth flip-flop provides input to the third flip-flop.

6. The apparatus of claim 1, wherein the test data and the test address sent according to the second clock signal are sent every n cycles of the first clock signal, where n is an integer greater than one.

7. The apparatus of claim 1,
wherein the first latency requirement is indicative of a first number of processor clock cycles required for the first memory device to perform a read or a write operation, and
wherein the second latency requirement is indicative of a second number of processor clock cycles required for the second memory device to perform the read or the write operation.

8. The apparatus of claim 1, wherein the second frequency is based on the first frequency, and wherein the second frequency is slower relative to the first frequency.

9. The apparatus of claim 1, wherein the memory test controller is further configured to:
send a write signal to trigger either the first memory device, according to the first clock signal, or the second memory device, according to the second clock signal, to write the test data to the test address;
send a read signal to trigger either the first memory device, according to the first clock signal, or the second memory device, according to the second clock signal, to output test data from the test address; and
compare the written test data with the output test data.

10. The apparatus of claim 8,
wherein writing the test data to the test address occurs on a first clock cycle,
wherein outputting the written test data occurs on a second clock cycle, and
wherein the first clock cycle and the second clock cycle are consecutive clock cycles of either the first clock signal or the second clock signal.

11. The apparatus of claim 1, wherein the first memory device is a first level cache memory, the second memory device is a second level cache memory, and wherein both the first memory device and the second memory device are part of a cache memory on the integrated circuit device.

12. An apparatus comprising:
a first means for storing electronic data having a first latency requirement;
a second means for storing electronic data having a second latency requirement;
a means for testing the first means for storing and the second means for storing, comprising:
receiving a first clock signal having a first frequency corresponding to the first latency requirement,
determining a second frequency corresponding to the second latency requirement, and
generating a second clock signal having the second frequency;
a means for sending test data to either the first memory device, according to the first clock signal, or the second memory device, according to the second clock signal; and
a means for sending a test address to either the first memory device, according to the first clock signal, or the second memory device, according to the second clock signal.

13. A method for dynamically testing a plurality of memory devices on an integrated circuit device, the method comprising:
receiving, by a memory test controller of the integrated circuit device, a first clock signal having a first frequency corresponding to a first latency requirement of a first memory device of the plurality of memory devices;
determining, by the memory test controller, a second frequency corresponding to a second latency requirement of a second memory device of the plurality of memory devices;
generating, by the memory test controller, a second clock signal having the second frequency;
sending, by a data generator of the integrated circuit device, test data to either the first memory device, according to the first clock signal, or the second memory device, according to the second clock signal; and
sending, by an address generator of the integrated circuit device, a test address to either the first memory device, according to the first clock signal, or the second memory device, according to the second clock signal.

* * * * *